(12) United States Patent
Fiolka

(10) Patent No.: US 8,035,803 B2
(45) Date of Patent: Oct. 11, 2011

(54) SUBSYSTEM OF AN ILLUMINATION SYSTEM OF A MICROLITHOGRAPHIC PROJECTION EXPOSURE APPARATUS

(75) Inventor: Damian Fiolka, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 576 days.

(21) Appl. No.: 11/850,255

(22) Filed: Sep. 5, 2007

(65) Prior Publication Data
US 2008/0055580 A1    Mar. 6, 2008

(30) Foreign Application Priority Data
Sep. 6, 2006   (DE) .................. 10 2006 042 144

(51) Int. Cl.
*G03B 27/72* (2006.01)
*G03B 27/42* (2006.01)

(52) U.S. Cl. .......................... 355/71; 355/53
(58) Field of Classification Search .................. None
See application file for complete search history.

(56) References Cited

U.S. PATENT DOCUMENTS

| | | | |
|---|---|---|---|
| 2003/0086156 A1 | 5/2003 | McGuire, Jr. | |
| 2005/0094268 A1 | 5/2005 | Fiolka et al. | |
| 2005/0140958 A1* | 6/2005 | Fiolka et al. | 355/71 |
| 2005/0146704 A1* | 7/2005 | Gruner et al. | 355/71 |
| 2005/0264885 A1* | 12/2005 | Albert | 359/489 |
| 2006/0055834 A1* | 3/2006 | Tanitsu et al. | 349/5 |
| 2006/0055909 A1* | 3/2006 | Fiolka et al. | 355/71 |
| 2006/0146384 A1 | 7/2006 | Schultz et al. | |
| 2006/0291057 A1 | 12/2006 | Fiolka et al. | |
| 2007/0008511 A1* | 1/2007 | De Boeij et al. | 355/71 |
| 2007/0019179 A1 | 1/2007 | Fiolka et al. | |
| 2007/0081114 A1 | 4/2007 | Fiolka et al. | |
| 2008/0123055 A1* | 5/2008 | Mori et al. | 353/20 |

FOREIGN PATENT DOCUMENTS

| | | |
|---|---|---|
| EP | 1 367 446 | 12/2003 |
| WO | WO 03/077011 A1 | 9/2003 |
| WO | WO 2004/102273 A2 | 11/2004 |
| WO | WO 2005/069081 A2 | 7/2005 |

* cited by examiner

*Primary Examiner* — Edward Glick
*Assistant Examiner* — Deoram Persaud
(74) *Attorney, Agent, or Firm* — Fish & Richardson P.C.

(57) ABSTRACT

In general, in one aspect, the disclosure features an illumination system for a microlithographic projection exposure apparatus configured so that during operation the illumination system illuminates a reticle plane of the microlithographic projection exposure apparatus with light of a desired polarization distribution. The illumination system includes a first polarization-influencing optical element and a second polarization-influencing optical element. During operation the first polarization-influencing optical element converts a first polarization distribution produced by a light source unit into a second polarization distribution which is different from the first polarization distribution. The second polarization-influencing optical element converts the second polarization distribution into a third polarization distribution corresponding to the desired polarization distribution, the second polarization-influencing optical element causing an effective rotation of the preferred polarization direction through 90° over its optically effective surface.

17 Claims, 3 Drawing Sheets

SUBSYSTEM OF AN ILLUMINATION SYSTEM OF A MICROLITHOGRAPHIC PROJECTION EXPOSURE APPARATUS

CROSS-REFERENCE TO RELATED APPLICATION

This application claims priority under 35 U.S.C. §119 to German Patent Application 10 2006 042 144.2, filed Sep. 6, 2006, the entire contents of which are hereby incorporated by reference.

FIELD

The disclosure relates to illumination systems for microlithographic projection exposure apparatus.

BACKGROUND

Microlithography can be used for the production of microstructured components such as for example integrated circuits or LCDs. The microlithography process is generally carried out in what is referred to as a projection exposure apparatus which has an illumination system and a projection objective. The image of a mask is typically illuminated by the illumination system (=reticle) and is typically projected by the projection objective on to a substrate (for example a silicon wafer) which is typically coated with a light-sensitive layer (for example photoresist) and arranged in the image plane of the projection objective in order to transfer the mask structure on to the light-sensitive coating on the substrate.

SUMMARY

A polarization distribution which is relatively well, for example constantly linear, in the entire reticle field, can be desirable for constant imaging contrast and thus defect-free imaging of lattice structures. Embodiments are disclosed which can reduce unwanted changes in the state of polarization from a desired polarization distribution in the reticle field. These unwanted changes can result from, for example, stress birefringence induced by holder components in the material of the optical components, such as for example lenses, polarization-influencing effects of dielectric layers and so forth.

In general, in a first aspect, the disclosure features an illumination system configured to be used in a microlithographic projection exposure apparatus. The microlithography projection exposure apparatus is configured so that during operation the illumination system illuminates a reticle plane of the microlithographic projection exposure apparatus with light of a desired polarization distribution. The illumination system includes a first polarization-influencing optical element and a second polarization-influencing optical element. During operation the first polarization-influencing optical element converts a first polarization distribution produced by a light source unit into a second polarization distribution which is different from the first polarization distribution. The second polarization-influencing optical element converts the second polarization distribution into a third polarization distribution corresponding to the desired polarization distribution, the second polarization-influencing optical element causing an effective rotation of the preferred polarization direction through 90° over its optically effective surface.

Embodiments of the system can include one or more of the following features. For example, the third polarization distribution can be different from the first polarization distribution. The third polarization distribution can be a linear polarization distribution with a varying preferred polarization direction.

In some embodiments, the illumination system has a pupil plane and during operation the second polarization distribution is produced in the pupil.

The first polarization-influencing optical element can include a first region and a second region which during operation cause a first and second polarization change for light passing through the first and second regions, respectively, the first polarization change being different from the second polarization change. The first polarization-influencing optical element can be a diffractive optical element. The diffractive optical element can include a raster structure of first regions and second regions. The first and second regions can be configured so that, during operation, the first regions cause a beam deflection different from the second regions for light passing through the first and second regions. Alternatively, or additionally, the first and second regions can be configured so that, during operation, the first regions cause a different change in the polarization state from the second regions for light passing through the first and second regions. During operation, the first regions can rotate the preferred polarization direction of the light passing therethrough through 90° and the second regions can leave the preferred polarization direction of the light passing therethrough unchanged.

The second polarization distribution can be an at least approximately radial polarization distribution and the desired polarization distribution is an at least approximately tangential polarization distribution.

In some embodiments, the first polarization-influencing optical element is an optical rotator which, during operation, causes a rotation of the preferred polarization direction through 90° for linearly polarized light passing therethrough. The second polarization distribution can be a linear polarization distribution with a constant preferred polarization direction and the third polarization distribution is a linear polarization distribution with a constant preferred polarization direction. The preferred polarization directions of the second and third polarization distributions can be oriented in mutually perpendicular relationship.

The first polarization-influencing optical element can be configured to be moved selectively into and out of the beam path.

In another aspect, the disclosure features a system that includes a projection objective having an object plane and an image plane and the illumination system as in the aforementioned aspect. During operation the illumination system illuminates an object positioned at the object plane and the projection objective images the object into the image plane. The system can further include a light source configured to direct light to the illumination system during operation of the microlithographic projection exposure apparatus.

In a further aspect, the disclosure features a process that includes providing a substrate to which there is at least partially applied a layer comprising a light-sensitive material, providing a mask which has structures to be imaged, providing in the system as in the aspect discussed in the preceding paragraph, and projecting at least a part of the mask on to a region of the layer using the system as in the aspect discussed in the preceding paragraph.

In another aspect, the disclosure features a microstructured component produced by the process of the aforementioned aspect.

The effective rotation of the preferred polarization direction through 90° (which is used to denote a rotation through 90°+N*180°, wherein N is a whole number), which is caused by the second polarization-influencing optical element over its whole optically effective surface, firstly involves the consequence in already known fashion that the perpendicular component of the electrical field strength vector of light passing through the second polarization-influencing optical element (that is to say the s-component) is interchanged with the parallel component of the electrical field strength vector (p-component) in relation to the system of the illumination arrangement. That provides a compensation effect in regard to the above-mentioned interference influences in the illumination system (layers, holders, materials of the optical components) as the phase acquired in the portion, disposed upstream of the second polarization-influencing optical element, of the illumination system between the p-component and the s-component, is acquired in the portion, disposed downstream of the second polarization-influencing optical element, of the illumination system with interchanged p- and s-components, that is to say the phase difference $\Delta(\phi_p-\phi_s)$ acquired upstream of the second polarization-influencing optical element is at least partially compensated by the phase difference $\Delta(\phi_s-\phi_p)$ acquired downstream thereof.

In certain embodiments, the first polarization-influencing optical element can be used to firstly set, from the original polarization distribution produced by the light source unit, a polarization distribution which is of such a nature that the desired polarization distribution is afforded only after passing through the second polarization-influencing optical element (which turns the preferred polarization direction through 90°) in the reticle plane. The consequence of this is that the above-described compensation effect can be achieved for all light beams. In that respect, the first polarization-influencing optical element firstly specifically produces a polarization distribution which after the subsequent 90° rotation of the preferred polarization direction, which is required for the above-indicated compensation effect, is converted in the entire pupil plane into the desired polarization distribution.

The term polarization-influencing element is used to denote any element which has the property of converting an input polarization state of light which impinges on that optical element into another polarization state (e.g., by rotation of the preferred polarization direction of the impinging light). Although that change in the polarization state can be effected for light which passes through the respective element, that is to say in the transmission mode, other implementations are also possible. In principle therefore a change in the polarization state of light which impinges on the respective optical element can also be effected by reflection or absorption of the light component of a given polarization state.

The appropriate design configuration of the first polarization-influencing optical element is dependent on the desired polarization distribution in the pupil.

In accordance with an embodiment that desired polarization distribution in the pupil plane is a linear polarization distribution with a preferred polarization direction which varies over the pupil plane, and the first polarization-influencing optical element has at least two regions which cause a mutually different change in the polarization state. The first polarization-influencing optical element can be a diffractive optical element which has a raster structure comprising first regions and second regions, wherein the first and second regions, for light passing therethrough, cause differing beam deflection and/or a different change in the polarization state.

In some embodiments, the second polarization distribution is an at least approximately radial polarization distribution and the desired (third) polarization distribution is an at least approximately tangential polarization distribution.

The expression 'linear polarization distribution' embraces any polarization distribution in respect of which the individual light beams are linearly polarized, wherein the vibration planes of the electrical field strength vector of different beams can also be oriented in mutually different directions. In accordance with the present application therefore the expression linear polarization distribution also embraces a radial polarization distribution (in which the preferred polarization direction of the individual light beams is oriented in parallel relationship with the radius directed on to the optical axis) or a tangential polarization distribution (in which the preferred polarization direction of the individual light beams is oriented in perpendicular relationship to the radius directed on to the optical axis).

In certain embodiments, the first polarization-influencing optical element is an optical rotator which causes rotation of the preferred polarization direction through 90° for linearly polarized light passing therethrough. Such a configuration can be advantageous if the second polarization distribution is a linear polarization distribution with a constant preferred polarization direction and the third polarization distribution is a linear polarization distribution with a constant preferred polarization direction, wherein the preferred polarization directions of the second and third polarization distributions are in mutually perpendicular orientation.

In some embodiments, the first polarization-influencing optical element can be selectively moved into and out of the beam path. In that way it can be removed from the beam path in the situation where the polarization distribution originally produced by the light source unit already corresponds to the distribution which is to be set directly upstream of the second polarization-influencing element, that is to say the originally produced polarization distribution, in conjunction with the 90° rotation, already affords the desired polarization distribution in the reticle plane.

Further configurations are set forth in the description and the claims.

BRIEF DESCRIPTION OF THE DRAWINGS

Embodiments are described in greater detail hereinafter via embodiments by way of example illustrated in the accompanying drawings in which.

DETAILED DESCRIPTION

Figure 1:
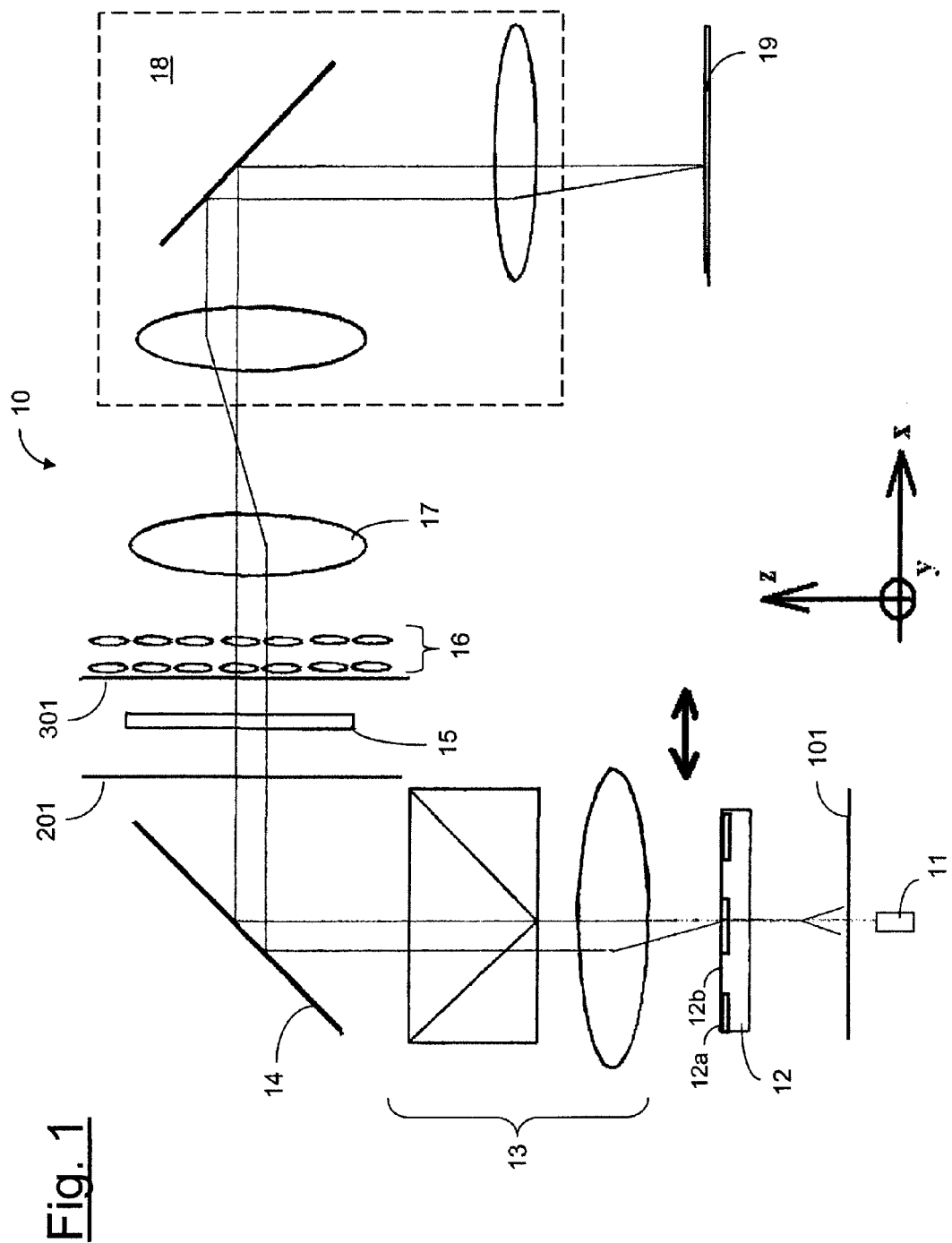
FIGS. 1 and 2 show diagrammatic views of different embodiments of an illumination system.

FIG. 1 shows a diagrammatic view of an illumination system 10 of a microlithography projection exposure apparatus. The illumination system 10 serves for illuminating a structure-bearing mask which is arranged in a reticle plane 19 and the structure of which is imaged on to a light-sensitive substrate with a projection objective (not shown in FIG. 1).

Figure 3:
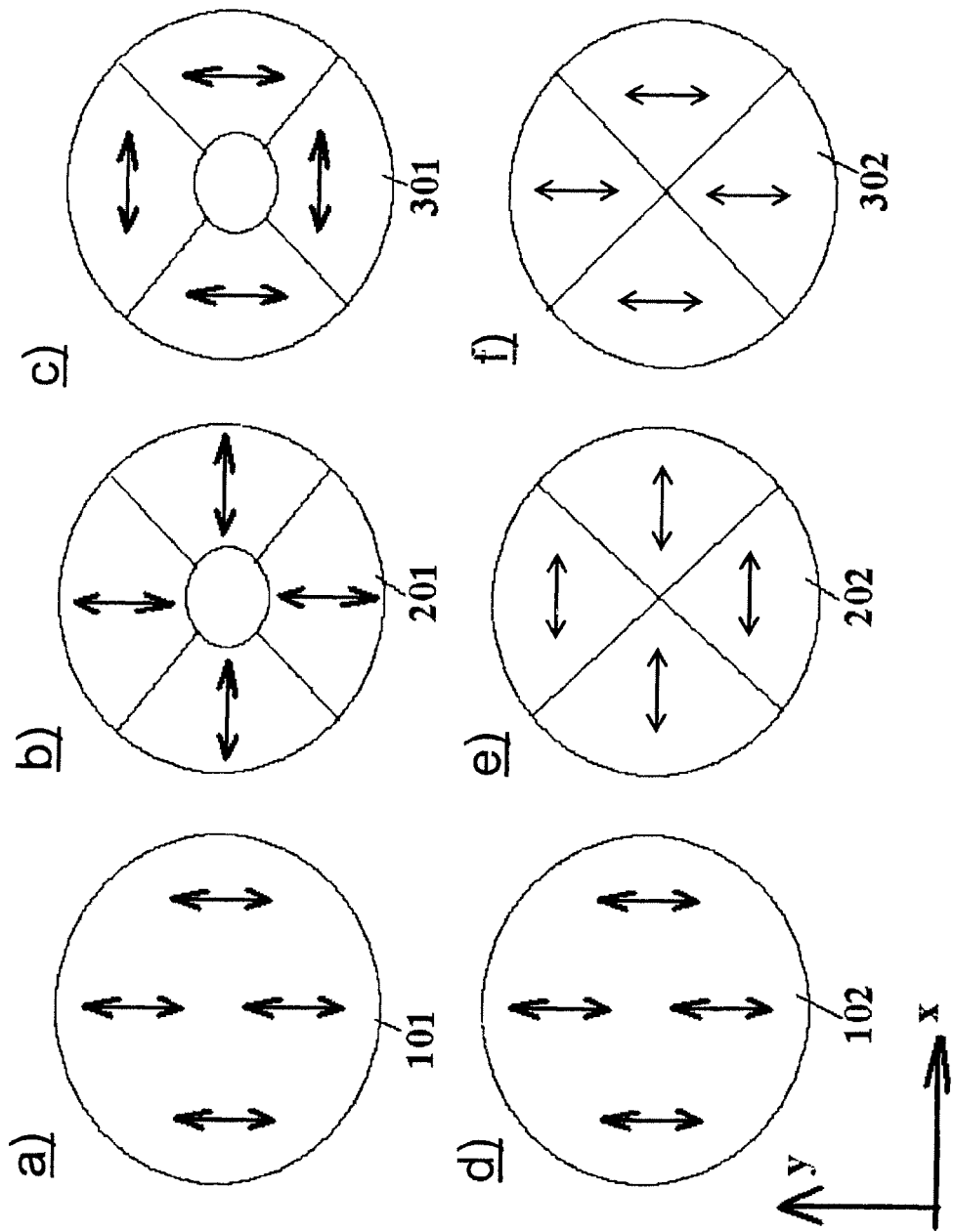
FIG. 3a-f show diagrammatic views of polarization distributions obtained in different planes of the illumination system of FIG. 1 and FIG. 2 respectively.

A light source unit 11 has a light source (for example an ArF laser for a working wavelength of 193 nm or an $F_2$ laser for a working wavelength of 157 nm) as well as a beam-forming optical arrangement which generates a parallel light beam. That parallel light beam firstly impinges in accordance with the specific embodiment on a diffractive optical element (DOE) 12 of the illumination system, the structure and action of which are described in fuller detail hereinafter. The polarization distribution upstream of the DOE 12 is identified by 101 and shown in FIG. 3a and represents a linear polarization distribution with a constant preferred polarization direction in the y-direction (with respect to the co-ordinate system respectively shown in FIG. 1 and FIG. 3).

Different illumination configurations are produced by the DOE 12 in conjunction with a subsequent zoom axicon lens 13 arranged in known manner, in the pupil plane arranged after a deflection mirror 14, depending on the respective zoom setting and position of the axicon lens elements. The polarization distribution in the region of the pupil plane downstream of the zoom axicon lens 13 is identified by reference 201 and shown in FIG. 3b. In accordance with the specific embodiment that polarization distribution 201 represents a 'quasi-radial' polarization distribution in which the preferred polarization direction is oriented exactly in the central plane of each of the four quadrants shown and at the other positions in approximately parallel relationship to the radius directed on to the optical axis.

Disposed immediately downstream of that pupil plane in the light propagation direction or also in the pupil plane itself is a polarization-influencing optical element 15 which effectively turns the preferred polarization direction of linearly polarized light passing therethrough through 90°. The polarization-influencing optical element 15 may be for example a plane-plate member of optically active quartz in which the optical crystal axis is oriented in parallel relationship with the optical axis of the illumination system (referred to as an optical rotator) and the thickness of which is so selected that the preferred polarization direction of linearly polarized light passing therethrough is rotated by the effect of circular birefringence through 90° (or more generally 90°+N*180°), When using synthetic, optically active crystalline quartz with the specific rotary power $\alpha$ of about 323.1°/mm at a wavelength of 193 nm and a temperature of 21.6° C. that condition corresponds to a thickness of the plane-plate member of about $d\approx(278.5+N*557)$ μm.

The polarization distribution which occurs downstream of the polarization-influencing optical element 15 is identified by reference 301 and is shown in FIG. 3c. That polarization distribution 301 represents a 'quasi-tangential' polarization distribution in which the preferred polarization direction 301 which is constant in each individual one of the four quadrants shown is oriented exactly in the central plane of the respective quadrant and at the other positions in approximately perpendicular relationship to the radius directed on to the optical axis.

The drawing only diagrammatically shows a light mixing system 16 which here in per se known manner has an arrangement of micro-optical elements which is suitable for generating a light mixing effect, but alternatively can also be in the form of a honeycomb condenser or in the form of a bar integrator of material which is transparent for light of the working wavelength, such as for example quartz glass or also crystalline calcium fluoride. An intermediate field plane arranged downstream of a subsequent optical imaging arrangement 17 is imaged in basically known manner through an REMA objective 18 (only diagrammatically indicated) on to the structure-bearing mask in the reticle plane 19 (reticle). The structure-bearing mask is imaged on to a light-sensitive substrate with a projection objective (not shown in FIG. 1).

The DOE 12, to provide the polarization distribution 201 shown in FIG. 3b, has a raster structure with regions 12a and 12b which have a different action on polarization of the light passing therethrough. Basically DOEs of that kind are known from EP 1 367 446 A1. More precisely the regions 12a rotate the preferred polarization direction of the light passing therethrough through 90°, whereas the regions 12b do not change the preferred polarization direction of the light passing therethrough. In addition the regions 12a and 12b have a different beam-deflecting action, in which respect more precisely, with reference to FIG. 3b, that is to say in regard to the illumination distribution occurring in the pupil plane, the regions 12a deflect the light only into the quadrants in mutually opposite relationship in the vertical direction whereas the regions 12b deflect the light only into the quadrants which are in opposite relationship in the horizontal direction. Consequently the 'quasi-radial' polarization distribution (see the polarization distribution 201 in FIG. 3b) arises out of the polarization distribution which was originally linear (that is to say before passing into the DOE 12), with a constant preferred polarization direction in the y-direction (see the polarization distribution 101 in FIG. 3a).

As a consequence of the rotation of the preferred polarization direction through 90°, which is caused by the polarization-influencing optical element 15, there is a 'quasi-tangential' polarization distribution in the reticle plane 19 (see the polarization distribution 301 in FIG. 3c).

As the rotation of the polarization through 90° takes place between two approximately optically symmetrically constructed sub-systems, the consequence of rotation of polarization is that the s-components (that is to say the component of the electrical field strength vector, which is perpendicular with respect to the plane of incidence) and the p-components (that is to say the component of the electrical field strength vector which is parallel with respect to the plane of incidence) of the first sub-system are interchanged with the p-components and s-components of the second sub-system so that as a result there is a compensation effect in respect of the acquired phase difference or the change in polarization.

The DOE 12 is used to set, in the pupil plane downstream of the zoom axicon lens 13, a polarization distribution 201 which is such that the desired polarization distribution occurs only after passing through an optical element in the reticle plane, which rotates the preferred polarization direction through 90°. The above-described compensation effect occurs for the entire pupil plane as the 90° rotation of the preferred polarization direction occurs for the light in all quadrants in FIG. 3b.

Figure 2:
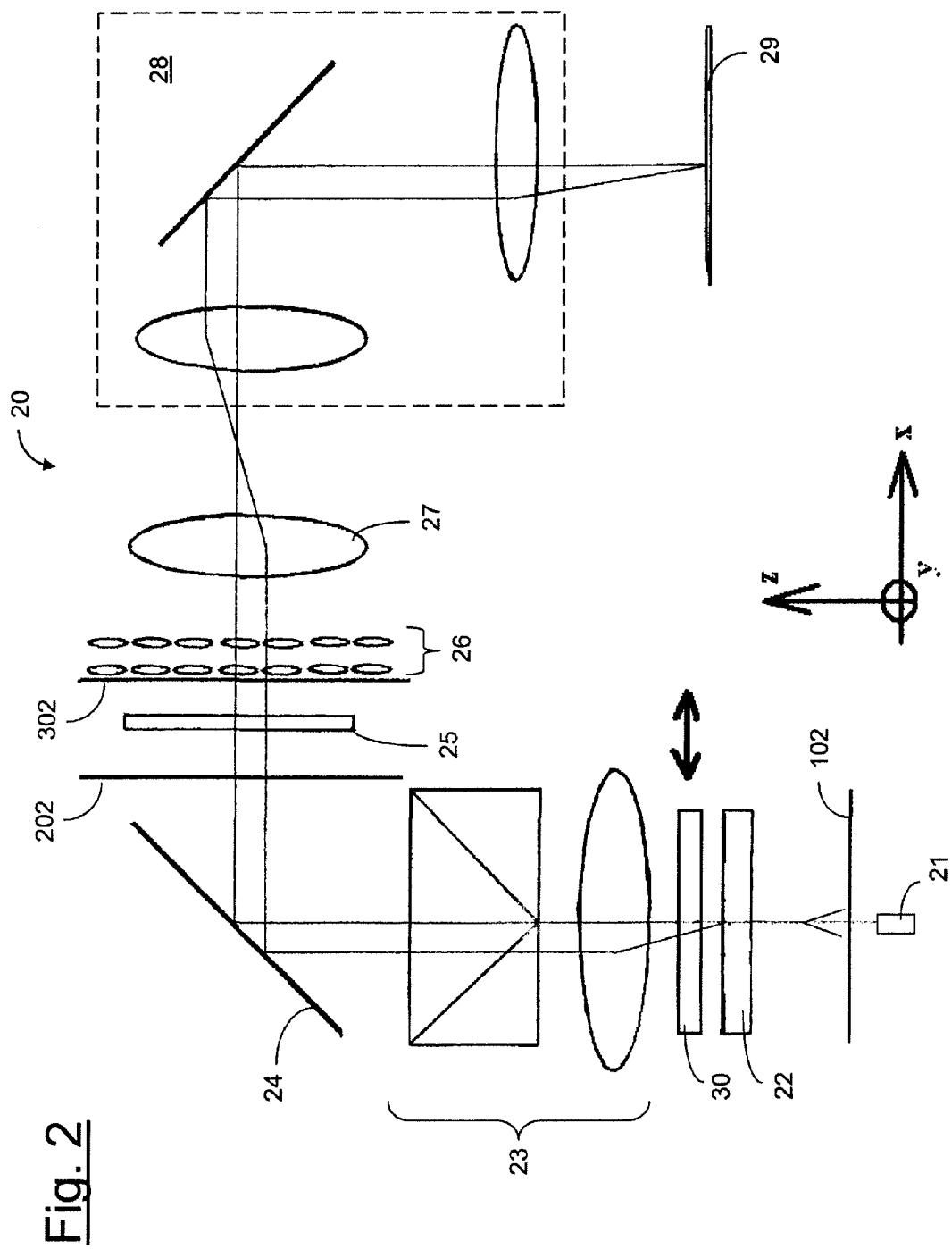

FIG. 2 shows a diagrammatic view of an illumination system 20, wherein elements substantially functionally identical to the embodiment of FIG. 1 are denoted by reference numerals increased by 10.

The embodiment shown in FIG. 2 is designed for the situation where it is not a quasi-tangential polarization distribution (see FIG. 3c) that is desired in the reticle plane, as in FIG. 1, but a linear polarization distribution with a constant preferred polarization direction, for example the polarization distribution 302 shown in FIG. 3f with a constant preferred polarization direction in the y-direction. The illumination system 20 is therefore so designed that the polarization distribution 302 is maintained downstream of the optical element 25, more specifically to achieve the above-described compensation effect still in conjunction with a 90° rotation of the preferred polarization direction, which is implemented by the polarization-influencing optical element 25, for the light in the entire pupil or in all quadrants in FIG. 3f.

For that purpose, it is possible to use a conventional DOE 22 (that is to say without the above-described raster structure consisting of regions which influence the polarization state in different ways). However so that the polarization distribution 302 is only achieved in conjunction with the optical element 25, an also linear polarization distribution with a constant preferred polarization direction which is rotated through 90° must be set directly upstream of the optical element 25 in the light propagation direction. For the situation where that preferred polarization direction does not already correspond to that of the laser light originally provided by the light source unit 20, but the latter is approximately the polarization distribution shown in FIG. 3a, with a constant preferred polarization direction in the y-direction, the illumination system 20 shown in FIG. 2 additionally has a polarization-influencing optical element 30 which can be selectively introduced into the beam path and which is also in the form of a 90° rotator corresponding to the optical element 25 and in the pupil plane, downstream of the zoom axicon lens 23, produces the polarization distribution 202 shown in FIG. 3e. The latter then affords the desired polarization distribution 302 similarly to FIG. 1 in conjunction with the 90° rotation by virtue of the optical element 25 in the reticle plane.

In accordance with a further embodiment, in a modification of the embodiment of FIG. 1, the illumination system can also be designed to provide in the reticle plane a tangential polarization distribution (that is to say not just 'quasi-tangential' polarization distribution), in respect of which the preferred polarization direction is oriented at all field positions in perpendicular relationship to the radius directed on to the optical axis. An approach which is similar to FIG. 1 would firstly provide modifying the DOE 12 in such a way that the polarization distribution produced upstream of the polarization-influencing optical element 15 corresponds to a radial (that is to say not just quasi-radial) polarization distribution, in respect of which the preferred polarization direction is oriented at all field positions in parallel relationship with the radius directed on to the optical axis. In order to avoid the production-engineering problems that that approach entails, in terms of the raster structure of the DOE, in accordance with an alternative embodiment also when further using the DOE 12 of FIG. 1 the polarization-influencing optical element 15 can not be in the form of a simple 90° rotator but can be in the form of a polarization-altering optical element which converts the quasi-radial polarization distribution 201 into a (continuous) tangential polarization distribution. A polarization-altering optical element of that kind can be made from optically active material (e.g., optically active quartz whose optical crystal axis is oriented in parallel relationship with the optical axis of the illumination system), wherein that element is of a thickness profile which varies over the cross-section (as measured in the direction of the optical axis), such that conversion of the quasi-radial polarization distribution 201 into a continuous polarization distribution is achieved over the entire cross-section of that polarization-altering optical element. Such a polarization-influencing optical element still always produces an effective rotation of the preferred polarization direction through 90° over a sub-region of its optically effective surface so that in this case also the above-described compensation effect is still in part achieved in regard to the accumulated phase difference or the change in polarization.

While certain embodiments have been described, numerous variations and alternative embodiments will be apparent to the person skilled in the art, for example by combination and/or exchange of features of individual embodiments. Accordingly other embodiments are in the claims.

The invention claimed is:

1. A system, comprising:
   a first polarization-influencing optical element which during operation converts a first polarization distribution produced by a light source unit into a second polarization distribution which is different from the first polarization distribution; and
   a second polarization-influencing optical element which during operation converts the second polarization distribution into a third polarization distribution corresponding to a desired polarization distribution, the second polarization-influencing optical element causing an effective rotation of the second polarization distribution through 90° over its optically effective surface, wherein:
   the second polarization distribution is an at least approximately radial polarization distribution and the desired polarization distribution is an at least approximately tangential polarization distribution;
   the system is a sub-system of an illumination system of a microlithographic projection exposure apparatus which during operation illuminates a reticle plane of the microlithographic projection exposure apparatus with light having the desired polarization distribution; and
   the first polarization-influencing optical element is upstream of any pupil plane of the illumination system along a path of light through the illumination system from the light source to the reticle plane.

2. The system of claim 1, wherein the third polarization distribution is different from the first polarization distribution.

3. The system of claim 1, wherein the third polarization distribution is a linear polarization distribution with a varying preferred polarization direction.

4. The system of claim 1, wherein the illumination system has a pupil plane and during operation the second polarization distribution is produced in the pupil plane.

5. The system of claim 1, wherein the first polarization-influencing optical element comprises a first region and a second region which during operation cause a first and second polarization change for light passing through the first and second regions, respectively, the first polarization change being different from the second polarization change.

6. The system of claim 1, wherein the first polarization-influencing optical element is a diffractive optical element.

7. The system of claim 6, wherein the diffractive optical element comprises a raster structure of first regions and second regions.

8. The system of claim 7, wherein the first and second regions are configured so that, during operation, the first regions cause a beam deflection different from the second regions for light passing through the first and second regions.

9. The system of claim 7, wherein the first and second regions are configured so that, during operation, the first regions cause a different change in the polarization distribution from the second regions for light passing through the first and second regions.

10. The system of claim 7, wherein, during operation, the first regions rotate the first polarization distribution of the light passing therethrough through 90° and the second regions leave the first polarization distribution of the light passing therethrough unchanged.

11. The system of claim 1, wherein the first polarization-influencing optical element is configured to be moved selectively into and out of the beam path.

12. A microlithography projection exposure apparatus, comprising:
    a projection objective having an object plane and an image plane; and
    an illumination system comprising the system of claim 1, wherein during operation the illumination system illuminates an object positioned at the object plane and the projection objective images the object into the image plane.

13. The system of claim 12, further comprising a light source configured to direct light to the illumination system during operation of the microlithographic projection exposure apparatus.

14. A process, comprising:
   providing a substrate to which there is at least partially applied a layer comprising a light-sensitive material;
   providing a mask which has structures to be imaged;
   providing a microlithographic projection exposure apparatus comprising:
      a projection objective having an object plane and an image plane; and
      an illumination system comprising the system of claim 1,
      wherein during operation the illumination system illuminates an object positioned at the object plane and the projection objective images the object into the image plane; and
   projecting at least a part of the mask on to a region of the layer using the microlithographic projection exposure apparatus.

15. The system of claim 1, wherein the first polarization-influencing optical element is an optical rotator which, during operation, causes a rotation of the preferred polarization direction through 90° for linearly polarized light passing therethrough.

16. The system of claim 15, wherein the second polarization distribution is a linear polarization distribution with a constant preferred polarization direction and the third polarization distribution is a linear polarization distribution with a constant preferred polarization direction.

17. The system of claim 16, wherein the preferred polarization directions of the second and third polarization distributions are oriented in mutually perpendicular relationship.

* * * * *

UNITED STATES PATENT AND TRADEMARK OFFICE
CERTIFICATE OF CORRECTION

| | | |
|---|---|---|
| PATENT NO. | : 8,035,803 B2 | Page 1 of 1 |
| APPLICATION NO. | : 11/850255 | |
| DATED | : October 11, 2011 | |
| INVENTOR(S) | : Fiolka | |

It is certified that error appears in the above-identified patent and that said Letters Patent is hereby corrected as shown below:

Column 4,
Line 45, Delete "FIG." and insert --FIGS.--

Signed and Sealed this
Sixth Day of December, 2011

David J. Kappos
*Director of the United States Patent and Trademark Office*